(12) United States Patent
Kadirvel et al.

(10) Patent No.: US 8,253,435 B2
(45) Date of Patent: Aug. 28, 2012

(54) METHODS AND APPARATUS TO DETECT VOLTAGE CONDITIONS OF POWER SUPPLIES

(75) Inventors: Karthik Kadirvel, Melbourne, FL (US); John H. Carpenter, Jr., Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 12/880,561

(22) Filed: Sep. 13, 2010

(65) Prior Publication Data

US 2012/0062272 A1 Mar. 15, 2012

(51) Int. Cl.
*G01R 31/40* (2006.01)
(52) U.S. Cl. .......... 324/764.01; 324/109; 324/76.66
(58) Field of Classification Search .......... 324/76.65, 324/76.66, 416
See application file for complete search history.

(56) References Cited

U.S. PATENT DOCUMENTS

| | | | | |
|---|---|---|---|---|
| 6,232,834 B1 * | 5/2001 | Zheng | | 330/107 |
| 6,259,286 B1 * | 7/2001 | Papaliolios | | 327/143 |
| 6,801,060 B2 * | 10/2004 | Ikehashi et al. | | 327/80 |
| 6,847,212 B1 | 1/2005 | Muhitch et al. | | |
| 2006/0033486 A1 | 2/2006 | Chou | | |

FOREIGN PATENT DOCUMENTS

| | | |
|---|---|---|
| EP | 1494034 | 1/2005 |
| EP | 2172784 | 4/2010 |

OTHER PUBLICATIONS

PCT Search Report mailed Jan. 10, 2012.

* cited by examiner

*Primary Examiner* — Richard Isla Rodas
(74) *Attorney, Agent, or Firm* — William B. Kempler; Wade J. Brady, III; Frederick J. Telecky, Jr.

(57) ABSTRACT

Methods and apparatus to detect voltage conditions of power supplies are disclosed. An example power supply monitor to detect fault conditions in a power supply includes a capacitive element communicatively coupled to the power supply, the capacitive element being configured to change state between a collapsed state and an open state in response to the power supply having a first voltage associated with a first fault condition of the power supply; a detector communicatively coupled to the capacitive element to detect a voltage spike generated from the state change of the capacitive element; and a signal generator to generate a fault signal in response to the voltage spike to indicate the power supply being in the first fault condition.

18 Claims, 6 Drawing Sheets

METHODS AND APPARATUS TO DETECT VOLTAGE CONDITIONS OF POWER SUPPLIES

FIELD OF THE DISCLOSURE

This disclosure relates generally to power monitoring and, more particularly, to methods and apparatus to detect voltage conditions of power supplies.

BACKGROUND

Electronic devices often employ one or more monitors to monitor a status of a power supply, which may include, for example, one or more lithium ion batteries, one or more nickel-metal hydride (NiMH) batteries, super capacitors, fuel cells, etc. The monitors are capable of determining when the power supply is operating within or outside a desired or normal operating voltage range. Example instances of operating outside the desired voltage range includes the power supply operating in an over-voltage condition, an under-voltage condition, and/or above or below any predetermined voltage threshold.

Figure 1:
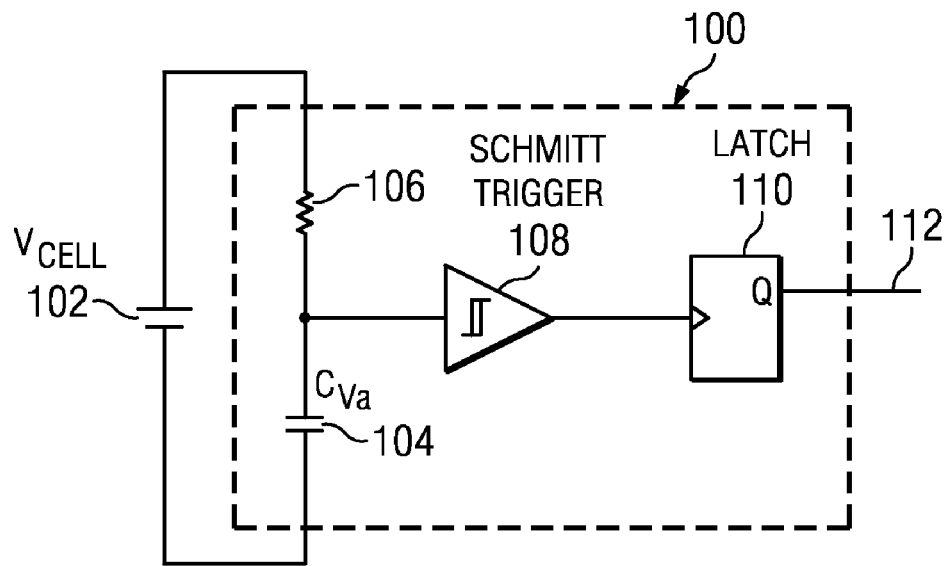
FIG. 1 is a schematic illustration of an example power supply monitor including an example capacitor configured to monitor a power supply for an over-voltage condition and a recovery therefrom according the example methods and apparatus described herein.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts that are in contact.

SUMMARY

The example methods, apparatus, systems, and/or articles of manufactures described herein are capable of detecting one or more conditions of a power supply. Example conditions to be detected by the methods and apparatus described herein include normal operating conditions and conditions outside a desired voltage range, such as an over-voltage condition, an under-voltage condition, and/or any voltage condition outside a predetermined range. To detect such conditions, an example method described herein includes communicatively coupling an example capacitor to a power supply to be monitored. The example capacitor of the example method is configured to change state in response to the power supply having a voltage associated with a first condition. The state change of the capacitor causes a generation of a signal indicative of the first condition.

DETAILED DESCRIPTION

The example methods and apparatus described herein are capable of detecting when a power supply is operating in a fault condition such as, for example, an over-voltage condition, an under-voltage condition, or any voltage condition determined to be outside of a predetermined range. An over-voltage condition refers to the power supply having a voltage above an upper limit of a voltage range in which the power supply is deemed to operate properly. An under-voltage condition refers to the power supply having a voltage below a lower limit of the voltage range in which the power supply is deemed to operate properly. The voltage range in which the power supply is deemed to operate properly is sometimes referred to herein as a desired voltage range. The desired voltage range may be defined by, for example, a manufacturer of a power supply or a designer of a circuit or device in which a power supply is implemented. The upper limit of the desired voltage range that defines an over-voltage condition is sometimes referred to herein as an over-voltage threshold. The lower limit of the desired voltage range that defines an under-voltage condition is sometimes referred to herein as an under-voltage threshold.

Generally, the example methods and apparatus described herein utilize tunable MEMS (Micro Electro-Mechanical Systems) capacitors to detect when a monitored power supply is operating in a fault condition. As described in detail below, the example MEMS capacitors described herein are tuned to collapse in a recoverable manner and/or open in response to an over-voltage condition or under-voltage condition, respectively, in a monitored power supply. Additionally, the example MEMS capacitors described herein are tuned to re-open or re-close in response to the power supply recovering from the over-voltage condition or under-voltage condition, respectively. The collapsing, opening, re-opening, and re-closing of the example MEMS capacitors described herein generate one or more signals indicative of the operating condition of the monitored power supply. These signals can be utilized in any number of ways to, for example, protect the power supply and/or circuitry and devices associated with (e.g., receiving power from) the power supply.

In comparison with previous power supply monitoring systems, such as monitors using CMOS (Complementary Metal-Oxide Semiconductor) devices that consume power in the order of micro watts, the example methods and apparatus described herein can provide zero current consumption (limited by leakage of one or more capacitors). Additionally, the example power supply monitors described herein can withstand higher voltages than previous monitors such as, for example, monitors using CMOS circuitry. This capability to monitor power supplies at higher voltage breakdown levels is especially advantageous in multi-cell battery packs used in, for example, hybrid electric vehicles in which hundreds of cells are used in series. Additionally, the example MEMS capacitors described herein provide hysteresis to a power supply monitor without consuming additional power. In contrast, previous systems, such as those using CMOS circuitry, require additional hysteresis circuitry that consumes additional power. Additional or alternative advantages and benefits of the disclosed examples are apparent from FIGS. 1-5 and the corresponding descriptions herein.

Figure 2:
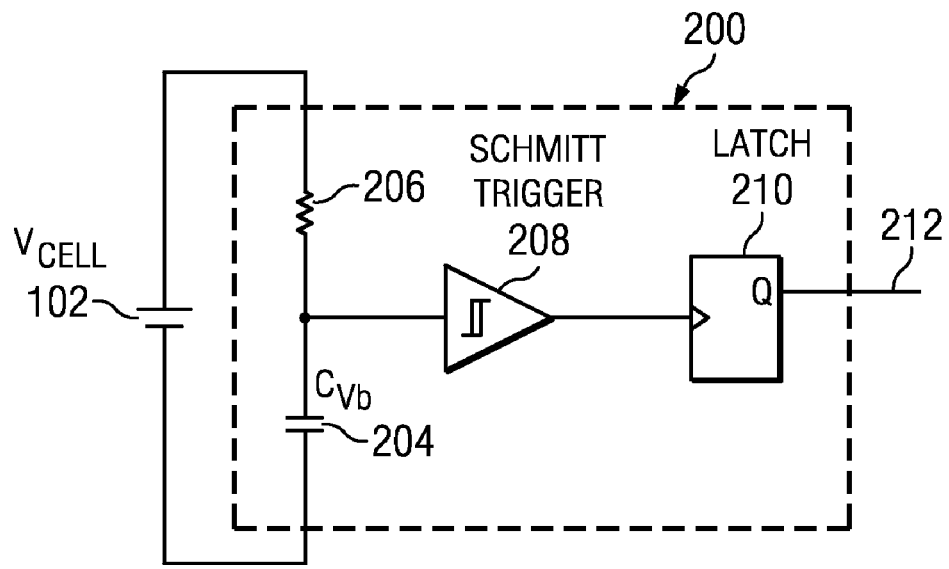
FIG. 2 is a schematic illustration of an example power supply monitor including an example capacitor configured to monitor a power supply for an under-voltage condition and a recovery therefrom according the example methods and apparatus described herein.

FIG. 1 is a schematic illustration of an example power supply monitor 100 configured to monitor an example power supply 102 for an over-voltage condition and a recovery therefrom. FIG. 2 is a schematic illustration of an example power supply monitor 200 configured to monitor the example power supply 102 for an under-voltage condition and a recovery therefrom. As described in detail below, the example power supply monitor 100 of FIG. 1 and the example power supply monitor 200 of FIG. 2 can be used to together to monitor the entire desired voltage range associated with the power supply 102. In the illustrated examples of FIGS. 1 and 2, the power supply 102 is a battery. However, the example methods and apparatus described herein can be used to monitor alternative types of power supplies and/or a power suppl (ies) including more than one battery or cell.

The example power supply monitor 100 of FIG. 1 is configured to detect when a voltage ($V_{CELL}$) of the example power supply 102 exceeds an over-voltage threshold of the desired voltage range specified for the power supply 102. In the illustrated example, the desired voltage range is defined to include voltages at which the example power supply 102 can operate properly and without causing damage to itself or any associated devices or circuitry.

The example power supply monitor 100 of FIG. 1 includes a tunable MEMS capacitor 104 coupled in series with a resistor 106. The example power supply monitor 100 of FIG. 1 also includes a Schmitt trigger 108 and a latch 110. Generally, the capacitor 104, the resistor 106, the Schmitt trigger 108, and the latch 110 cooperate to generate an output 112 indicative of an operating condition of the power supply 102.

The example capacitor 104, which has a capacitance ($C_V$) that varies as a function of $V_{CELL}$, is communicatively coupled to the power supply 102. The example capacitor 104 of FIG. 1 is tuned or configured such that the plates of the capacitor 104 collapse in a non-destruction and recoverable manner in response to the $V_{CELL}$ exceeding the over-voltage threshold associated with the power supply 102. The voltage applied to the capacitor 104 that causes such a collapse is referred to herein as the pull-in voltage. Tuning of the example capacitor 104 to have a pull-in voltage corresponding to the over-voltage threshold is described in detail below in connection with FIG. 3.

During operation of the power supply 102 within the desired voltage range, the plates of the capacitor 104 are open. Accordingly, the input into the Schmitt trigger 108 is a logical high when the power supply 102 is operating within the desired voltage range. When the capacitor 104 collapses in response to $V_{CELL}$ exceeding the over-voltage threshold, a negative going spike is generated at the input of the Schmitt trigger 108. The Schmitt trigger 108 converts the spike to a clean negative going edge and outputs the same to the latch 110.

In the illustrated example of FIG. 1, the output 112 of the latch 110 is initially set to a logical high. When the Schmitt trigger 108 conveys the negative going edge to the latch 110, the latch 110 is reset. In the illustrated example of FIG. 1, a reset of the latch 110 causes the output 112 to indicate that the voltage of the power supply 102 exceeded the over-voltage threshold. The output 112 can be used in any suitable manner to protect the power supply 102 and/or any associated circuitry from damage erroneous operation, etc. For example, the output 112 can be conveyed back to the power supply 102 as a disable signal. Additionally or alternatively, the output 112 can be conveyed to a controller or processor, such as the processor 812 of the example computer 800 described below in connection with FIG. 8, capable of disabling the power supply 102 and/or any associated circuitry that may be affected by the operation of the power supply 102. In some examples, the output 112 can be used to restrict or limit the operation of the power supply 102 instead of disabling the power supply 102.

While the power supply 102 is disabled or restricted for a certain period of time due to detection of an over-voltage condition, $V_{CELL}$ decreases and, barring unexpected circumstances, eventually returns to the desired voltage range. That is, $V_{CELL}$ falls below the over-voltage threshold. The example capacitor 104 of FIG. 1 is tuned such that the plates of the capacitor 104 re-open (from the collapsed state described above) in response to $V_{CELL}$ falling to a certain value below the over-voltage threshold. The value below the over-voltage threshold is selected to introduce hysteresis into the power supply monitor 100. That value is referred to herein as the pull-out voltage. Accordingly, the hysteresis of the example power supply monitor 100 of FIG. 1 is substantially equal to a difference between the pull-in voltage of the capacitor 104 and the pull-out voltage of the capacitor 104. Tuning of the example capacitor 104 to a specific pull-out voltage is described in detail below in connection with FIG. 3.

When the plates of the example capacitor 104 re-open in response to $V_{CELL}$ reaching the pull-out voltage of the capacitor 104, a positive going spike is generated at the input of the Schmitt trigger 108. The Schmitt trigger 108 converts the spike to a clean positive going edge and outputs the same to the latch 110.

When the latch 110 was previously reset in response to an over-voltage condition, the latch 110 is set in response to the positive going edge generated by the Schmitt trigger 108. The example latch 110 being set cause the output 112 to return to a logical high to indicate that $V_{CELL}$ has returned or recovered to the desired voltage range. The output 112 can be used in any suitable manner to activate or un-restrict operation of the power supply 102 and/or any associated circuitry previously disabled or restricted due to an over-voltage condition. For example, the output 112 can be conveyed back to the power supply 102 as an enable signal. Additionally or alternatively, the output 112 can be conveyed to a controller or processor, such as the processor 812 of the example computer 800 described below in connection with FIG. 8, capable of enabling or un-restricting the power supply 102 and/or any associated circuitry that may be affected by the operation of the power supply 102.

The example power supply monitor 200 of FIG. 2 is configured to detect when $V_{CELL}$ falls below an under-voltage threshold of the desired voltage range specified for the power supply 102. As demonstrated by the following description, the example power supply monitor 200 of FIG. 2 operates in a similar, but inverse manner as the example power supply monitor 100 of FIG. 1.

The example power supply monitor 200 of FIG. 2 includes a tunable MEMS capacitor 204 coupled in series with a resistor 206. The example power supply monitor 200 of FIG. 2 also includes a Schmitt trigger 208 and a latch 210. Generally, the capacitor 204, the resistor 206, the Schmitt trigger 208, and the latch 210 cooperate to generate an output 212 indicative of an operating condition of the power supply 102.

The example capacitor 204, which has a capacitance ($C_V$) that varies as a function of $V_{CELL}$, is communicatively coupled to the power supply 102. The example capacitor 204 of FIG. 2 is tuned or configured such that the plates of the capacitor 204 are collapsed (in a non-destruction and recoverable manner) when $V_{CELL}$ is within the desired voltage range. Further, the example capacitor 204 of FIG. 2 is tuned such that the plates of the capacitor 204 open in response to $V_{CELL}$ falling below the under-voltage threshold associated with the power supply 102. As described above, the voltage applied to the capacitor 204 that causes the plates to open is referred to herein as the pull-out voltage. Tuning of the example capacitor 204 to have a pull-out voltage corresponding to the under-voltage threshold is described in detail below in connection with FIG. 3.

Because the plates of the capacitor 104 are collapsed during operation of the power supply 102 within the desired voltage range, the input into the Schmitt trigger 208 is a logical low when the power supply 102 is operating within the desired voltage range. When the capacitor 204 opens in response to $V_{CELL}$ falling below the under-voltage threshold, a positive going spike is generated at the input of the Schmitt trigger 208. The Schmitt trigger 208 converts the spike to a clean positive going edge and outputs the same to the latch 210.

In the illustrated example of FIG. 2, the output 212 of the latch 210 is initially set to a logical low. When the Schmitt trigger 208 conveys the positive going edge to the latch 210, the output 212 of the latch 210 is toggled to indicate that the voltage of the power supply 102 fell below the under-voltage threshold. The output 212 can be used in any suitable manner to protect the power supply 102 and/or any associated circuitry from damage erroneous operation, etc. For example, the output 212 can be conveyed back to the power supply 102 as a disable signal. Additionally or alternatively, the output 212 can be conveyed to a controller or processor, such as the processor 812 of the example computer 800 described below in connection with FIG. 8, capable of disabling the power supply 102 and/or any associated circuitry that may be affected by the operation of the power supply 102. In some examples, the output 212 can be used to restrict or limit the operation of the power supply 102 instead of disabling the power supply 102.

While the power supply 102 is disabled or restricted for a certain period of time due to detection of an under-voltage condition, $V_{CELL}$ increases and, barring unexpected circumstances, eventually returns to the desired voltage range. That is, $V_{CELL}$ exceeds the under-voltage threshold. The example capacitor 204 of FIG. 2 is tuned such that the plates of the capacitor 204 re-collapse (from the open state described above) in response to $V_{CELL}$ exceeding a certain value above the under-voltage threshold. The value above the under-voltage threshold is selected to introduce hysteresis into the power supply monitor 200. As described above, that value is referred to herein as the pull-in voltage. Accordingly, the hysteresis of the example power supply monitor 200 of FIG. 1 is substantially equal to a difference between the pull-out voltage of the capacitor 204 and the pull-in voltage of the capacitor 204. Tuning of the example capacitor 204 to a specific pull-in voltage is described in detail below in connection with FIG. 3.

When the plates of the example capacitor 204 re-collapse in response to $V_{CELL}$ reaching the pull-in voltage of the capacitor 204, a negative going spike is generated at the input of the Schmitt trigger 208. The Schmitt trigger 208 converts the spike to a clean negative going edge and outputs the same to the latch 210.

The clean negative going edge toggles the output 212 of the latch 210 to indicate that $V_{CELL}$ has returned or recovered to the desired voltage range. The output 212 can be used in any suitable manner to activate or un-restrict operation of the power supply 102 and/or any associated circuitry previously disabled or restricted due to an under-voltage condition. For example, the output 212 can be conveyed back to the power supply 102 as an enable signal. Additionally or alternatively, the output 212 can be conveyed to a controller or processor, such as the processor 812 of the example computer 800 described below in connection with FIG. 8, capable of enabling or un-restricting the power supply 102 and/or any associated circuitry that may be affected by the operation of the power supply 102.

The configuration of the Schmitt trigger 108-b, the latch 110-b, and the output 112-b is sometimes referred to herein as a detector circuit and can be implemented by any suitable circuit, device, and/or configuration capable of detecting the voltage spikes generated by the capacitors 104 and 204 and generating a corresponding output 112 and 212 to indicate a fault condition of the power supply 102 and a recovery therefrom.

While example manners of implementing the power supply monitors described herein have been illustrated in FIGS. 1 and 2, one or more of the elements, processes and/or devices illustrated in FIGS. 1 and 2 may be combined, divided, rearranged, omitted, eliminated and/or implemented in any other way. Further, the example capacitors 104, 204, the example resistors 106, 206, the example Schmitt triggers 108, 208, the example latches 110, 210, and/or, more generally, the example power supply monitors 100 and 200 of FIGS. 1 and 2 may be implemented by hardware, software, firmware and/or any combination of hardware, software and/or firmware. Thus, for example, any of the example capacitors 104. 204, the example resistors 106, 206, the example Schmitt triggers 108, 208, the example latches 110, 210, and/or, more generally, the example power supply monitors 100 and 200 of FIGS. 1 and 2 could be implemented by one or more circuit (s), programmable processor(s), application specific integrated circuit(s) (ASIC(s)), programmable logic device(s) (PLD(s)) and/or field programmable logic device(s) (FPLD (s)), etc. When any of the appended apparatus claims are read to cover a purely software and/or firmware implementation, at least one of the example capacitors 104, 204, the example resistors 106, 206, the example Schmitt triggers 108, 208, the example latches 110, 210, and/or, more generally, the example power supply monitors 100 and 200 of FIGS. 1 and 2 are hereby expressly defined to include a computer readable medium such as a memory, DVD, CD, etc. storing the software and/or firmware. Further still, the power supply monitors 100 and 200 of FIGS. 1 and 2 may include one or more elements, processes and/or devices in addition to, or instead of, those illustrated in FIGS. 1 and 2, and/or may include more than one of any or all of the illustrated elements, processes and devices.

Figure 3:
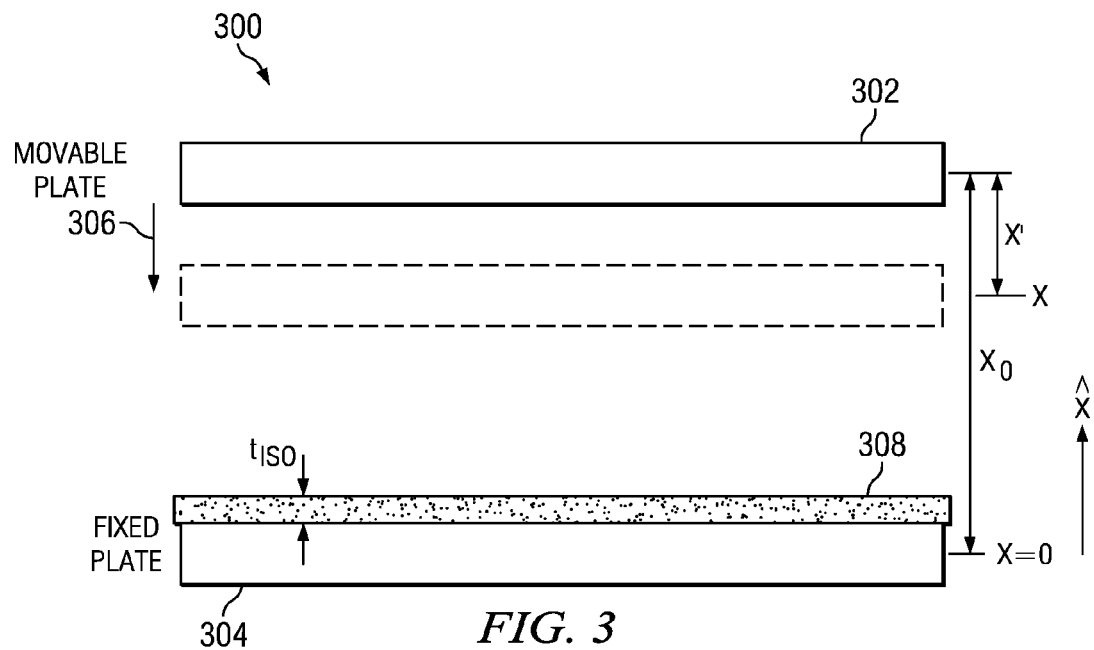
FIG. 3 is a cross-sectional diagram of the example capacitors of FIGS. 1 and 2.

FIG. 3 is a cross-sectional diagram of a capacitor 300 capable of implementing the example capacitors 104 and 204 of FIGS. 1 and 2. As described above, the example MEMS capacitors 104 and 204 of FIGS. 1 and 2 can be tuned to have a pull-in voltage and a pull-out voltage. According to the methods and apparatus described herein, the capacitors 104 and 204 of FIGS. 1 and 2 are tuned to have a pull-in and pull-out voltages capable of indicating a fault condition of the power supply 102 and a recovery therefrom.

The example tunable capacitor 300 of FIG. 3 includes a movable plate 302 and a fixed plate 304. In response to the pull-in voltage being applied to the capacitor 300, the movable plate 302 moves in the direction indicated by an arrow labeled with reference numeral 306 towards the fixed plate 304. Typically, such a collapse of the plates 302 and 304 can potentially damage the capacitor 300 and, therefore, is typically avoided. However, the example methods and apparatus described herein utilize this collapse to generate the outputs 112 and 212 of FIGS. 1 and 2, respectively, to indicate a fault condition or a recovery therefrom.

To prevent damage to the capacitor 300, an isolation layer 308 is disposed on a surface of the fixed plate 304 facing the movable plate 302. As a result, when the movable plate 302 collapses in response to the pull-in voltage being applied to the capacitor 300, the movable plate 302 is forced onto the isolation layer 308, thereby preventing, for example, a short circuit.

The pull-in voltage and the pull-out voltage of the capacitor 300 can be tuned by configuring dimensions and aspects of the capacitor. The pull-in voltage of the capacitor 300 is given by Equation 1 and the pull-out voltage of the capacitor 104 is given by Equation 2.

$$V_{PULL-IN} = x_0 \sqrt{\frac{8kx_0}{27\varepsilon A}},$$ Equation 1

$$V_{PULL-OUT} = x_0 \sqrt{\frac{2kt_{ISO}}{\varepsilon A}}.$$ Equation 2

In Equations 1 and 2, $x_0$ represents a gap between the movable plate 302 and the fixed plate 304 in an open position; $t_{ISO}$ represents a thickness of the isolation layer 308; x represents a distance between the movable plate 302 and the fixed plate 304; A represents an area of the plates 302 and 304; $\in$ represents a dielectric constant between the plates 302 and 304; and k represents a spring constant of the movable plate 302, which is determined by the thickness of the movable plate 302 and material constants associated therewith (according to Young's modulus and Poisson's ratio). As shown in FIG. 3, x' represents a displacement of the movable plate 302 from the fixed plate 304 and x-hat shows the positive x direction. In the illustrated example, $t_{ISO}$ is significantly less than $x_0$.

The above equations for the pull-in and pull-out voltages demonstrate that each can be controlled independently. For example, the pull-in voltage can be tuned by setting or adjusting $x_0$, while the pull-out voltage can be tuned by setting or adjusting $t_{ISO}$. Therefore, one configuring the pull-in and pull-out voltages for the capacitor 104 can control the hysteresis of the corresponding power supply monitor 100 or 200. As described above, the hysteresis is defined by a difference between the pull-in voltage and the pull-out voltage of the capacitor 104.

For example, when the power supply 102 is recovering from an over-voltage condition as detected by the example capacitor 104 of FIG. 1, the example capacitor 104 does not re-open (after collapsing in response to the over-voltage condition) immediately after $V_{CELL}$ falls below the over-voltage threshold to which the pull-in voltage corresponds. Rather, the example capacitor 104 of FIG. 1 is tuned to have a pull-out voltage less than the pull-in voltage by a certain amount corresponding to the desired amount of hysteresis for the example power supply monitor 100. As a result, the example capacitor 104 does not re-open and, thus, generate a recovery signal on the output 112 until $V_{CELL}$ is within the desired voltage range by an amount defined by the hysteresis. A similar, but inverse configuration can be applied to the example power supply 200 of FIG. 2 and the example capacitor 204 thereof.

Figure 4:
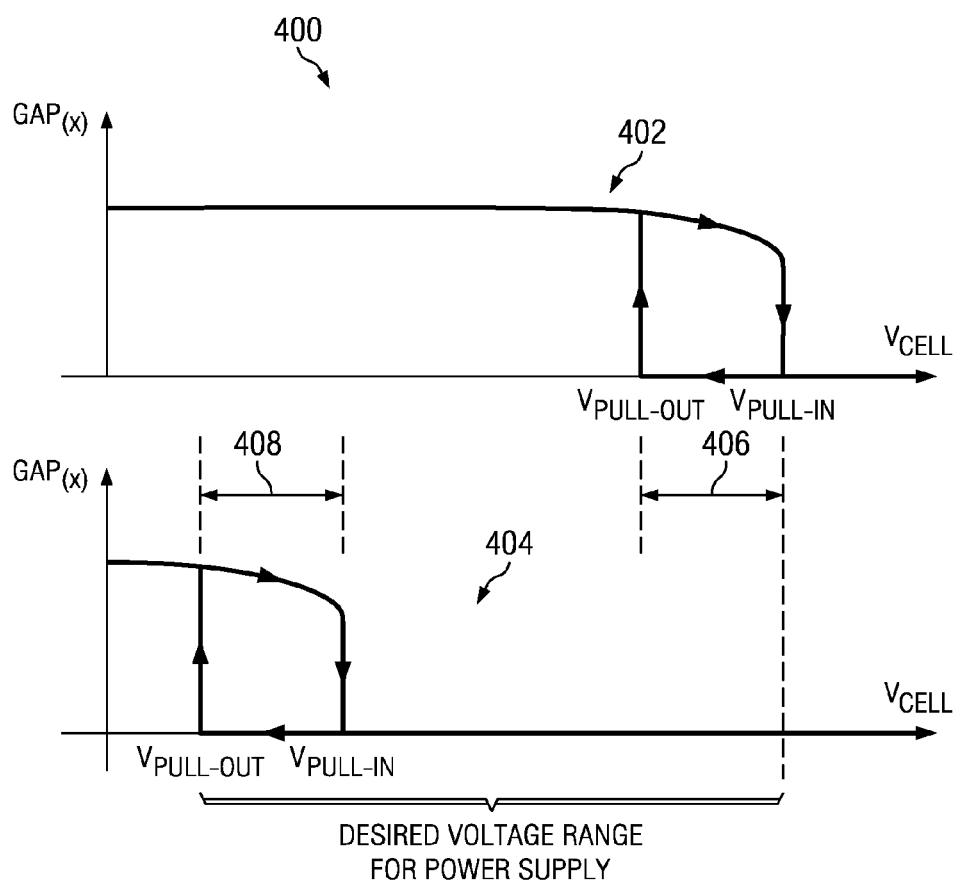
FIG. 4 is a plot of gap distance between plates of the example capacitors of FIGS. 1, 2 and/or 3 as a function of battery voltage.

FIG. 4 is a plot 400 of gap distance (x) between the plates 302 and 304 of the example capacitors 104, 204, 300 of FIGS. 1, 2 and/or 3 as a function of $V_{CELL}$. The plot 400 includes a first graph 402 corresponding to the example capacitor 104 of FIG. 1 configured to monitor the power supply 102 for an over-voltage condition and a second graph 404 corresponding to the example capacitor 204 of FIG. 2 configured to monitor the power supply 102 for an under-voltage condition. The first and second graphs 402 and 404 are vertically aligned in FIG. 4 to demonstrate an example relationship between the example capacitor 104 of FIG. 1 and the example capacitor 204 of FIG. 2. However, some examples may include alternative relationships and/or configurations between the capacitors 104 and 204. For example, the pull-out voltage shown in the first graph 402 may be at a lesser voltage than the pull-in voltage shown in the second graph 404. That is, the first and second graphs 402 and 404 may overlap at portions corresponding to changes in states, such as an open state and a collapsed state, of the capacitors 104 and 204.

Regarding the first graph 402 corresponding to the over-voltage capacitor 104 of FIG. 1, x is reduced to nearly zero (limited by the thickness of the isolation layer 308) when $V_{CELL}$ exceeds the pull-in voltage after residing in the desired voltage range. As shown in the first graph 402, the pull-out voltage of the capacitor 104 of FIG. 1 corresponds to an upper limit of the desired voltage range for the power supply 102. When recovering from an over-voltage condition, x remains near zero until the pull-out voltage is reached. The example capacitor 104 of FIG. 1 remains collapsed after a recovery from the over-voltage condition for at least a portion of the desired voltage range. The distance between the plates 302 and 304 quickly increases when the pull-out voltage of the over-voltage capacitor 104 of FIG. 1 is reached. Thus, the hysteresis of the example capacitor 104 of FIG. 1 is shown by the voltage difference labeled with reference numeral 406 in the first graph 402 of FIG. 4.

Regarding the second graph 404 corresponding to the under-voltage capacitor 204 of FIG. 2, x quickly increases when $V_{CELL}$ reaches the pull-out voltage after residing in the desired voltage range. As shown in the second graph 404, the pull-in voltage of the capacitor 204 of FIG. 2 corresponds to a lower limit of the desired voltage range for the power supply 102. When recovering from an under-voltage condition, x remains at a point corresponding to the plates 302 and 304 being open until the pull-in voltage is reached. The example capacitor 204 of FIG. 2 remains open after a recovery from the under-voltage condition for at least a portion of the desired voltage range. The distance between the plates 302 and 304 quickly decreases when the pull-in voltage of the under-voltage capacitor 204 of FIG. 2 is reached. Thus, the hysteresis of the example capacitor 204 of FIG. 2 is shown by the voltage difference labeled with reference numeral 408 in the second graph 404 of FIG. 4.

Figure 5:
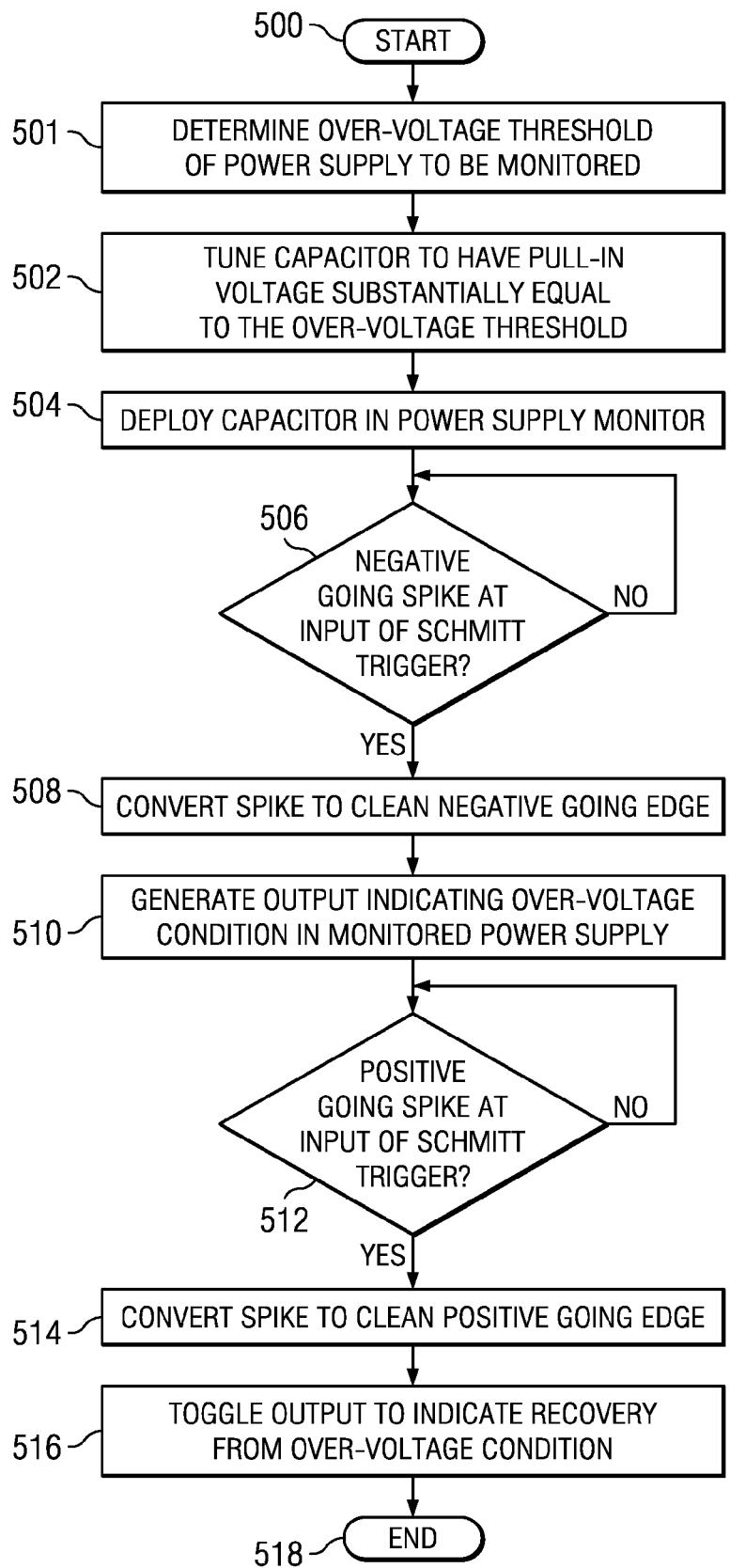
FIG. 5 is a flowchart representative of an example process, which may be implemented using machine readable instructions, for implementing the example power supply monitor of FIG. 1.
Figure 6:
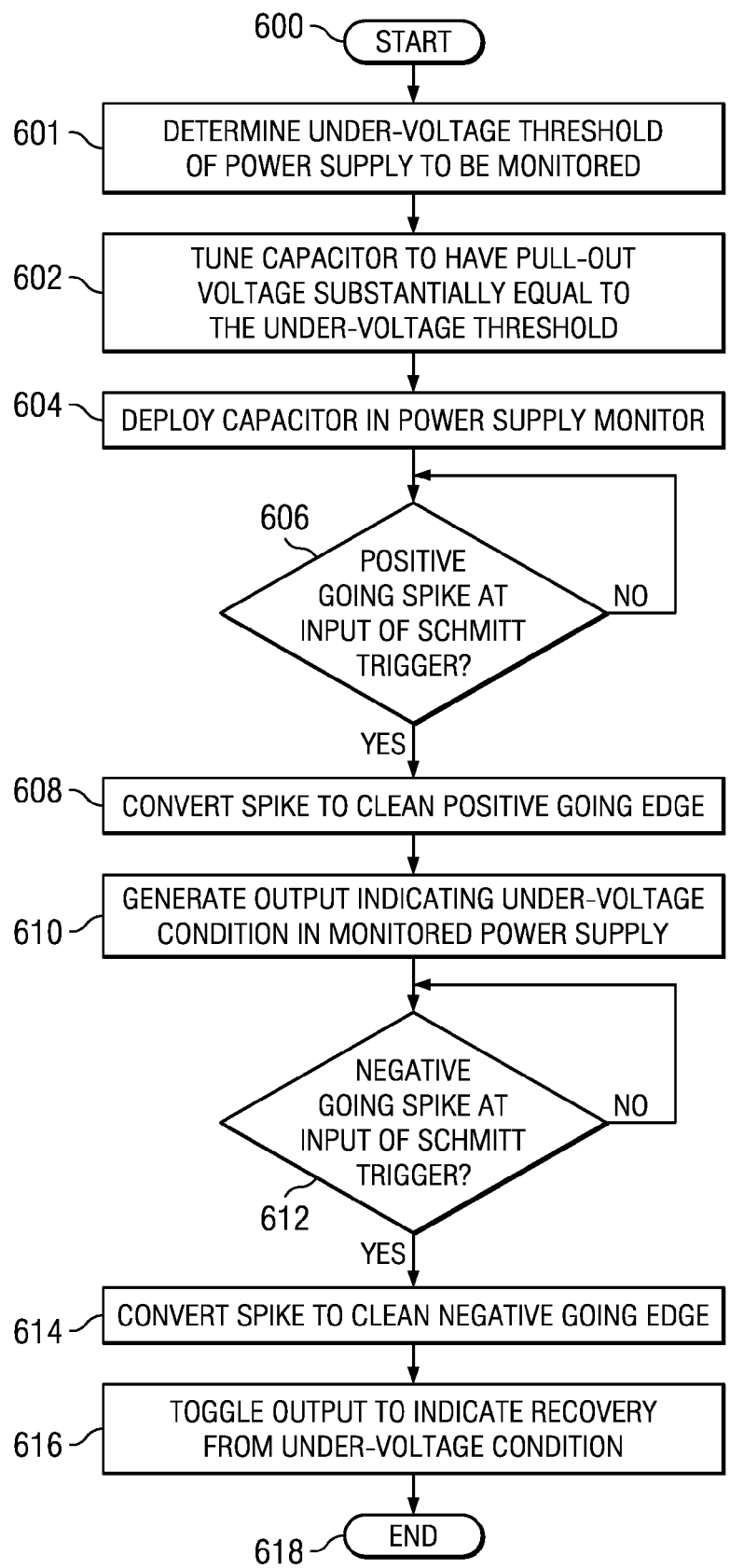
FIG. 6 is a flowchart representative of an example process, which may be implemented using machine readable instructions, for implementing the example power supply monitor of FIG. 2.

FIG. 5 is a flowchart for implementing the example power supply monitor 100 of FIG. 1. FIG. 6 is a flowchart for implementing the example power supply monitor 200 of FIG.

2. In some instances, one or more processes or elements of the example flowcharts of FIGS. 5 and/or 6 may be performed using machine readable instructions. In such instances, the machine readable instructions comprise a program for execution by a processor such as the processor 812 shown in the example computer 800 discussed below in connection with FIG. 8. The program may be embodied in software stored on a computer readable medium such as a CD-ROM, a floppy disk, a hard drive, a digital versatile disk (DVD), or a memory associated with the processor 812, but the entire program and/or parts thereof could alternatively be executed by a device other than the processor 812 and/or embodied in firmware or dedicated hardware. Further, although the example program is described with reference to the flowcharts illustrated in FIGS. 5 and 6, many other methods of implementing the example power supply monitors 100 and/or 200 may alternatively be used. For example, the order of execution of the blocks may be changed, and/or some of the blocks described may be changed, eliminated, or combined.

As mentioned above, the example processes of FIGS. 5 and 6 may be implemented using coded instructions (e.g., computer readable instructions) stored on a tangible computer readable medium such as a hard disk drive, a flash memory, a read-only memory (ROM), a compact disk (CD), a digital versatile disk (DVD), a cache, a random-access memory (RAM) and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage and to exclude propagating signals. Additionally or alternatively, the example processes of FIGS. 5 and 6 may be implemented using coded instructions (e.g., computer readable instructions) stored on a non-transitory computer readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

The flowchart of FIG. 5 begins with a decision to monitor the power supply 102 (block 500). A value for an over-voltage threshold is determined for the power supply 102 of FIG. 1 by, for example, a manufacture of the power supply 102 (block 501). As described above, the over-voltage threshold defines an upper limit of a desired voltage range in which the power supply 102 can operate properly. Because the example power supply monitor 100 of FIG. 1 is dedicated to detecting when $V_{CELL}$ exceeds the over-voltage threshold, the capacitor 104 is tuned to have a pull-in voltage substantially equal to the over-voltage threshold (block 502). The capacitor 104 is then deployed in the example power supply monitor 100 by communicatively coupling the capacitor 104 with the power supply 102, the resistor 106, the Schmitt trigger 108, and the latch 110 as illustrated in FIG. 1 (block 504).

The power supply monitor 100 can then continuously monitor the power supply 102. If the pull-in voltage configured at block 502 is reached, a negative going spike will be generated at the input of the Schmitt trigger 108. When the negative going spike is presented to the input of the Schmitt trigger 108 (block 506), the spike is converted to a clean negative going edge by the Schmitt trigger 108 (block 508). Otherwise, the power supply monitor 100 continues to monitor the power supply 102 (block 506).

Referring back to block 508, the negative going edge generated by the Schmitt trigger 108 causes the latch 110 to generate the output 112 to indicate that an over-voltage condition has occurred in the power supply 102 (block 510). As described above, the output 112 can be used by any suitable device, such as the processor 812 of FIG. 8, to remedy and/or protect from the over-voltage condition.

The capacitor 104 remains collapsed and, therefore, the output 112 remains indicative of the over-voltage condition until the pull-out voltage is reached at the power supply 102. The capacitor 104 re-opens in response to the pull-out voltage being reached. The re-opening of the capacitor 104 causes a positive going spike at the input of the Schmitt trigger 108. When such a spike is presented to the Schmitt trigger 108 (block 512), the Schmitt trigger 108 converts the spike to a clean positive going edge (block 514). Otherwise, the power supply monitor 100 continues to monitor the power supply 102 for a recovery from the over-voltage condition (block 512).

Referring back to block 512, the positive going edge generated by the Schmitt trigger 108 causes the latch 110 to toggle the output 112 to indicate that the power supply 102 has recovered from the over-voltage condition (block 516). As described above, the output 112 can be used by any suitable device, such as the processor 812 of FIG. 8, to re-enable or un-restrict the operation of the power supply 102. The example flowchart of FIG. 5 then ends (block 518).

The flowchart of FIG. 6 begins with a decision to monitor the power supply 102 (block 600). A value for an under-voltage threshold is determined for the power supply 102 FIG. 2 by, for example, a manufacture of the power supply 102 (block 601). As described above, the under-voltage threshold defines a lower limit of a desired voltage range in which the power supply 102 can operate properly. Because the example power supply monitor 200 of FIG. 2 is dedicated to detecting when $V_{CELL}$ falls below the under-voltage threshold, the capacitor 204 is tuned to have a pull-out voltage substantially equal to the under-voltage threshold (block 602). The capacitor 204 is then deployed in the example power supply monitor 200 by communicatively coupling the capacitor 204 with the power supply 102, the resistor 206, the Schmitt trigger 208, and the latch 210 as illustrated in FIG. 2 (block 604).

The power supply monitor 200 can then continuously monitor the power supply 102. If the pull-out voltage configured at block 602 is reached, a positive going spike will be generated at the input of the Schmitt trigger 208. When the positive going spike is presented to the input of the Schmitt trigger 208 (block 606), the spike is converted to a clean positive going edge by the Schmitt trigger 208 (block 608). Otherwise, the power supply monitor 200 continues to monitor the power supply 102 (block 606).

Referring back to block 608, the positive going edge generated by the Schmitt trigger 208 causes the latch 210 to generate the output 212 to indicate that an under-voltage condition has occurred in the power supply 102 (block 610). As described above, the output 212 can be used by any suitable device, such as the processor 812 of FIG. 8, to remedy and/or protect from the under-voltage condition.

The capacitor 204 remains open and, therefore, the output 212 remains indicative of the under-voltage condition until the pull-in voltage is reached at the power supply 102. The capacitor 204 re-collapses in response to the pull-in voltage being reached. The re-collapsing of the capacitor 204 causes a negative going spike at the input of the Schmitt trigger 208.

When such a spike is presented to the Schmitt trigger 208 (block 612), the Schmitt trigger 208 converts the spike to a clean negative going edge (block 614). Otherwise, the power supply monitor 200 continues to monitor the power supply 102 for a recovery from the under-voltage condition (block 612).

Referring back to block 612, the negative going edge generated by the Schmitt trigger 208 causes the latch 210 to toggle the output 212 to indicate that the power supply 102 has recovered from the under-voltage condition (block 616). As described above, the output 212 can be used by any suitable device, such as the processor 812 of FIG. 8, to re-enable or un-restrict the operation of the power supply 102. The example flowchart of FIG. 6 then ends (block 618).

Figure 7:
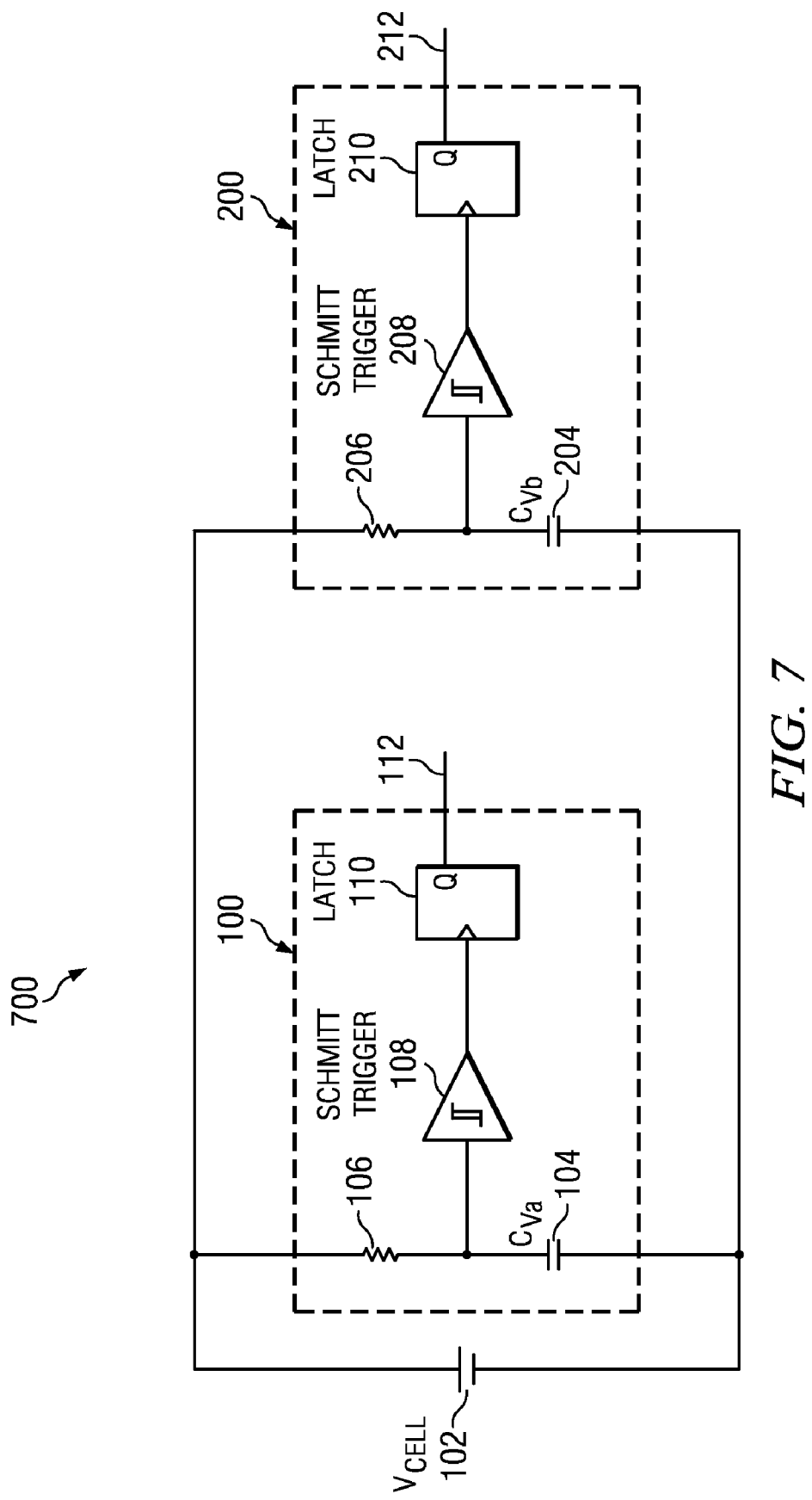
FIG. 7 is a schematic illustration of the example power supply monitor of FIG. 1 and the example power supply monitor of FIG. 2 implemented in an example circuit to detect both an over-voltage condition and an under-voltage condition of the example power supply of FIGS. 1 and 2.

FIG. 7 is a schematic illustration of an example configuration of an example circuit 700 configured to monitor the example power supply 102 of FIGS. 1 and 2 for an over-voltage condition and an under-voltage condition. In particular, the example circuit 700 of FIG. 7 includes the example power supply monitor 100 of FIG. 1 and the example power supply monitor 200 of FIG. 2 coupled in parallel. As a result, the capacitor 104 of the example power supply monitor 100 of FIG. 1 and the capacitor 204 of the example power supply monitor 200 of FIG. 2 are affected by $V_{CELL}$. Accordingly, the example power supply monitor 100 of FIG. 1 and the example power supply monitor 200 of FIG. 2 can generate the outputs 112 and 212, respectively, to indicate whether the power supply 102 is in an over-voltage condition or an under-voltage condition. The example circuit 700 of FIG. 7 is an example configuration of combining the example power supply monitor 100 of FIG. 1 and the example power supply monitor 200 of FIG. 2, as other configurations and/or circuits are possible.

Figure 8:
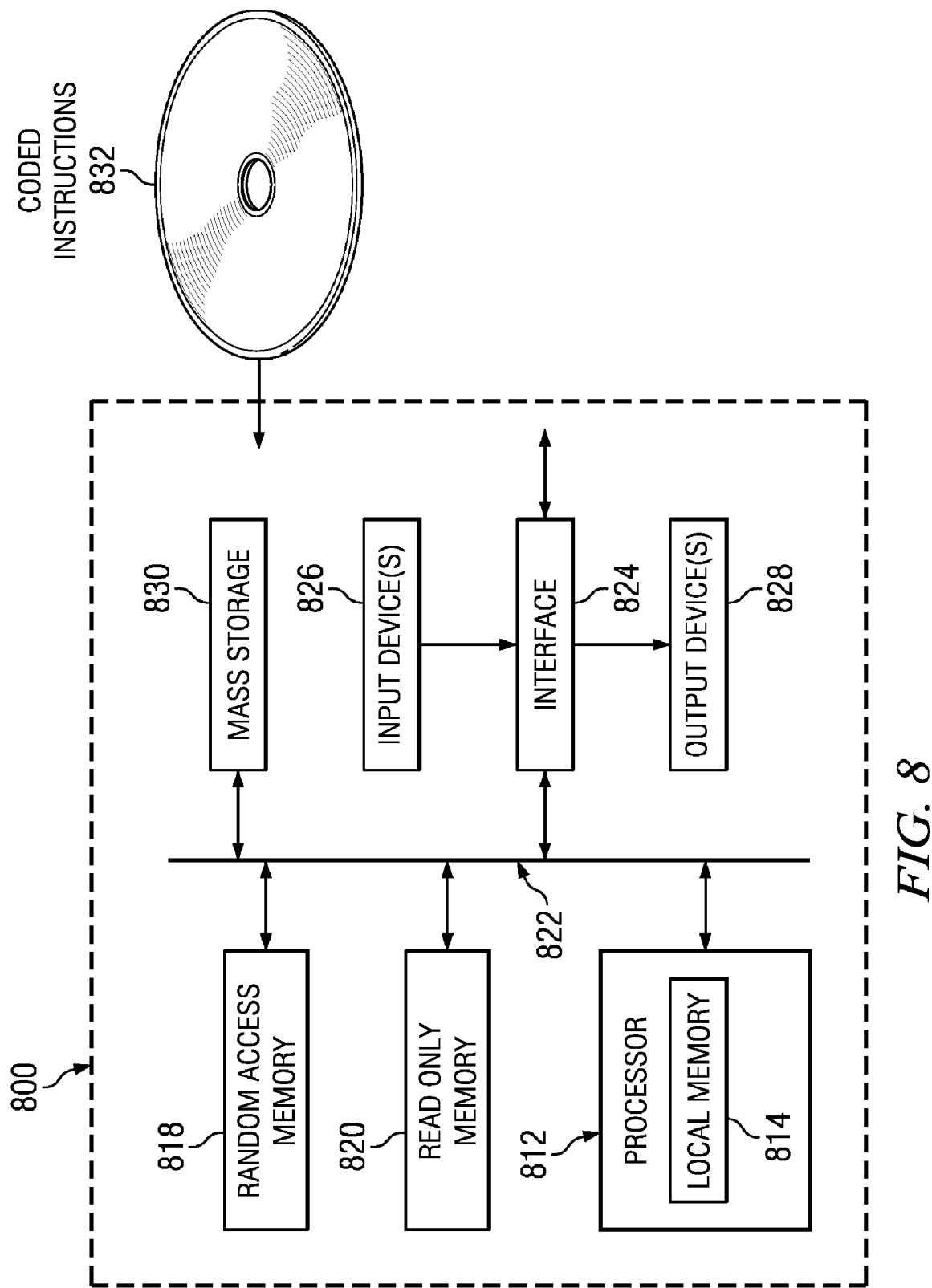
FIG. 8 is a block diagram of an example computer that may execute, for example, the machine-readable instructions of FIGS. 5 and/or 6 to implement the example power supply monitors of FIGS. 1, 2, and/or 3.

FIG. 8 is a block diagram of an example computer 800 capable of executing at least one of the instructions of FIGS. 5 and/or 6 to implement the power supply monitors 100 and/or 200 of FIGS. 1 and 2. The computer 800 can be, for example, a server, a personal computer, a mobile phone (e.g., a cell phone), a personal digital assistant (PDA), an Internet appliance, a set top box, or any other type of computing device.

The computer 800 of the instant example includes a processor 812. For example, the processor 812 can be implemented by one or more Intel® microprocessors from the Pentium® family, the Itanium® family or the XScale® family. Of course, other processors from other families are also appropriate.

The processor 812 is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is typically controlled by a memory controller (not shown).

The computer 800 also includes an interface circuit 820. The interface circuit 820 may be implemented by any type of interface standard, such as an Ethernet interface, a universal serial bus (USB), and/or a PCI express interface.

One or more input devices 822 are connected to the interface circuit 820. The input device(s) 822 permit a user to enter data and commands into the processor 812. The input device(s) can be implemented by, for example, a keyboard, a mouse, a touchscreen, a track-pad, a trackball, isopoint and/or a voice recognition system.

One or more output devices 824 are also connected to the interface circuit 820. The output devices 824 can be implemented, for example, by display devices (e.g., a liquid crystal display, a cathode ray tube display (CRT), a printer and/or speakers). The interface circuit 820, thus, typically includes a graphics driver card.

The interface circuit 820 also includes a communication device (e.g., the request servicer) such as a modem or network interface card to facilitate exchange of data with external computers via a network 826 (e.g., an Ethernet connection, a digital subscriber line (DSL), a telephone line, coaxial cable, a cellular telephone system, etc.).

The computer 800 also includes one or more mass storage devices 828 for storing software and data. Examples of such mass storage devices 828 include floppy disk drives, hard drive disks, compact disk drives, and digital versatile disk (DVD) drives.

The coded instructions of FIGS. 5 and 6 may be stored in the mass storage device 828, in the volatile memory 814, in the non-volatile memory 816, and/or on a removable storage medium such as a CD or DVD.

Although certain example apparatus, methods, and articles of manufacture are described herein, other implementations are possible. The scope of coverage of this patent is not limited to the specific examples described herein. On the contrary, this patent covers all apparatus, methods, and articles of manufacture falling within the scope of the invention.

What is claimed is:

1. A power supply monitor to detect voltage conditions in a power supply, the power supply monitor comprising:
   a capacitive element communicatively coupled to the power supply, the capacitive element comprising a movable plate changing position with respect to a fixed plate and having an isolation layer disposed on a surface of the movable plate or the fixed plate and being configured to change state between a collapsed state and an open state in response to the power supply having a first voltage associated with a first condition of the power supply;
   a detector communicatively coupled to the capacitive element to detect a voltage spike generated from the state change of the capacitive element; and
   a signal generator to generate a signal in response to the voltage spike to indicate the power supply being in the first condition.

2. A power supply monitor as defined in claim 1, the first condition being an over-voltage condition, wherein the capacitive element is configured to be in the collapsed state in response to the power supply having the first voltage.

3. A power supply monitor as defined in claim 2, wherein the capacitive element is configured to be in the open state when a voltage of the power supply is within a desired voltage range.

4. A power supply monitor as defined in claim 1, the first condition being an under-voltage condition, wherein the capacitive element is configured to be in the open state in response to the power supply having the first voltage.

5. A power supply monitor as defined in claim 4, wherein the capacitive element is configured to be in the collapsed state when a voltage of the power supply is within a desired voltage range.

6. A power supply monitor as defined in claim 1, wherein the capacitive element comprises a tunable Micro Electro-Mechanical Systems (MEMS) capacitor.

7. A method of detecting voltage conditions of a power supply, the method comprising:

configuring a capacitive element comprising a movable plate changing position with respect to a fixed plate and having an isolation layer disposed on a surface of the movable plate or the fixed plate and communicatively coupled to a power supply, to change state between a collapsed state and an open state in response to the power supply having a first voltage associated with a first condition of the power supply; and placing a detector in communication with the capacitive element to detect a voltage spike generated from the state change of the capacitive element, wherein the detector is to generate a signal in response to the voltage spike to indicate the power supply being in the first condition.

8. A method as defined in claim 7, the first condition being an over-voltage condition, wherein the capacitive element is configured to be in the collapsed state in response to the power supply having the first voltage.

9. A method as defined in claim 8, wherein the capacitive element is configured to be in the open state when a voltage of the power supply is within a desired voltage range.

10. A method as defined in claim 7, the first condition being an under-voltage condition, wherein the capacitive element is configured to be in the open state in response to the power supply having the first voltage.

11. A method as defined in claim 10, wherein the capacitive element is configured to be in the collapsed state when a voltage of the power supply is within a desired voltage range.

12. A method as defined in claim 7, wherein the power supply comprises at least one of a battery pack having a plurality of cells, one or more super capacitors, or one or more fuel cells.

13. A method as defined in claim 7, wherein the capacitive element comprises a tunable Micro Electro-Mechanical Systems (MEMS) capacitor.

14. An power supply monitor to detect voltage conditions of a power supply, the power supply monitor comprising:

a first capacitor communicatively coupled to the power supply having a first movable plate to be separated from a first fixed plate by a first distance when the power supply is in a non-fault condition, wherein the first movable plate is to collapse onto a first isolation layer of the first fixed plate in response to a over-voltage condition in the power supply;

a first detector circuit communicatively coupled to the first capacitor to generate a first fault signal in response to detecting the first movable plate collapsing onto the isolation layer of the first fixed plate;

a second capacitor communicatively coupled to the power supply having a second movable plate to engage an isolation layer of a second fixed plate when the power supply is in a non-fault condition, wherein the second movable plate is to disengage from the isolation layer of the second fixed plate in response to an under-voltage condition in the power supply; and a second detector circuit communicatively coupled to the second capacitor to generate a second fault signal in response to detecting the second movable plate disengaging from the second fixed plate.

15. A power supply monitor as defined in claim 14, wherein the first movable plate is to disengage from the isolation layer of the first fixed plate in response to a recovery from the over-voltage condition.

16. A power supply monitor as defined in claim 15, wherein the recovery from the over-voltage condition comprises a voltage of the power supply reaching a hysteresis voltage.

17. A power supply monitor as defined in claim 14, wherein the second movable plate is to engage the isolation layer of the second fixed plate in response to a recovery from the under-voltage condition.

18. A power supply monitor as defined in claim 17, wherein the recovery from the under-voltage condition comprises a voltage of the power supply reaching a hysteresis voltage.

* * * * *